United States Patent [19]
Phillips

[11] 4,012,307
[45] Mar. 15, 1977

[54] METHOD FOR CONDITIONING DRILLED HOLES IN MULTILAYER WIRING BOARDS

[75] Inventor: Eugene Phillips, Diamond Bar, Calif.

[73] Assignee: General Dynamics Corporation, Pomona, Calif.

[22] Filed: Dec. 5, 1975

[21] Appl. No.: 638,008

[52] U.S. Cl. .......................... 204/192 E; 204/164; 156/644; 29/625; 29/628; 174/68.5

[51] Int. Cl.[2] ................................... C23C 15/00

[58] Field of Search .............. 204/164, 192; 156/3; 29/625, 628; 174/68.5

[56] References Cited
UNITED STATES PATENTS

| | | | |
|---|---|---|---|
| 3,276,106 | 10/1966 | Bester et al. | 156/3 X |
| 3,410,774 | 11/1968 | Barson et al. | 204/192 |
| 3,598,710 | 8/1971 | Davidse | 204/192 |
| 3,705,055 | 12/1972 | Christensen et al. | 427/38 |
| 3,867,216 | 2/1975 | Jacob | 156/2 |
| 3,930,913 | 1/1976 | Jacob | 156/8 |

Primary Examiner—John H. Mack
Assistant Examiner—Aaron Weisstuch
Attorney, Agent, or Firm—Henry M. Bissell; Edward B. Johnson

[57] ABSTRACT

A method for conditioning drilled holes in multilayer printed wiring boards by removing layers of smeared plastic and adhesive prior to metal plating through the holes for interconnecting conductive layers of the boards includes baking the drilled boards and etching the boards within a plasma reactor chamber, with a predetermined gas pressure, the plasma being created by an RF generator. At the end of a predetermined time period, the RF generator is deactivated and atmospheric air is admitted to the reactor chamber. The reactor chamber is then purged of gases and the printed wiring boards are removed.

10 Claims, 3 Drawing Figures

U.S. Patent    Mar. 15, 1977    4,012,307
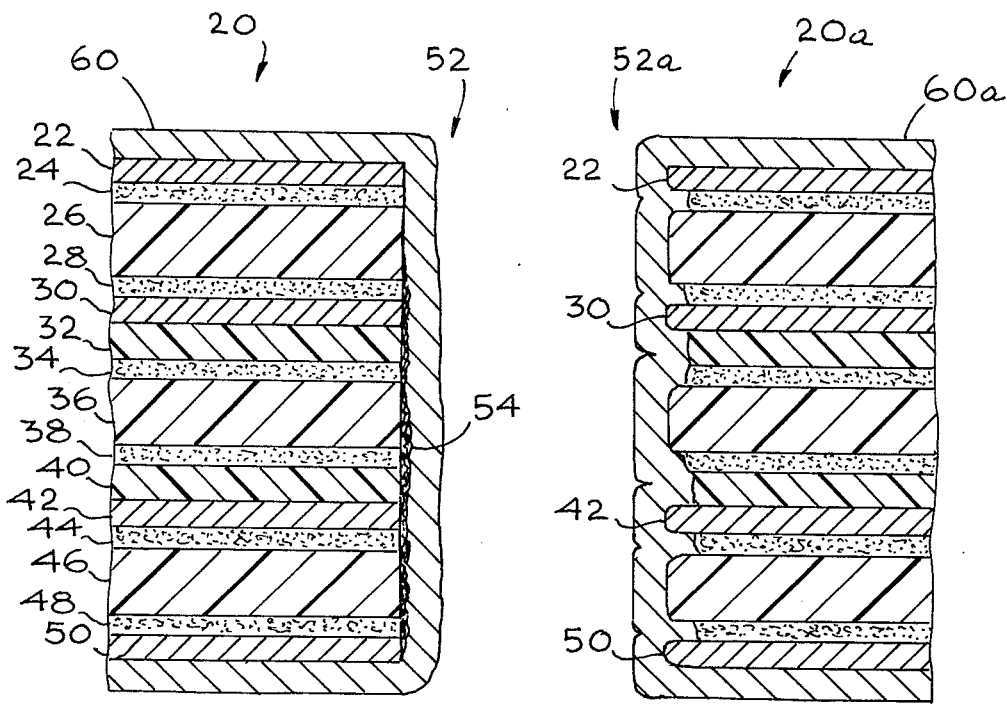
Fig. 1
Fig. 2
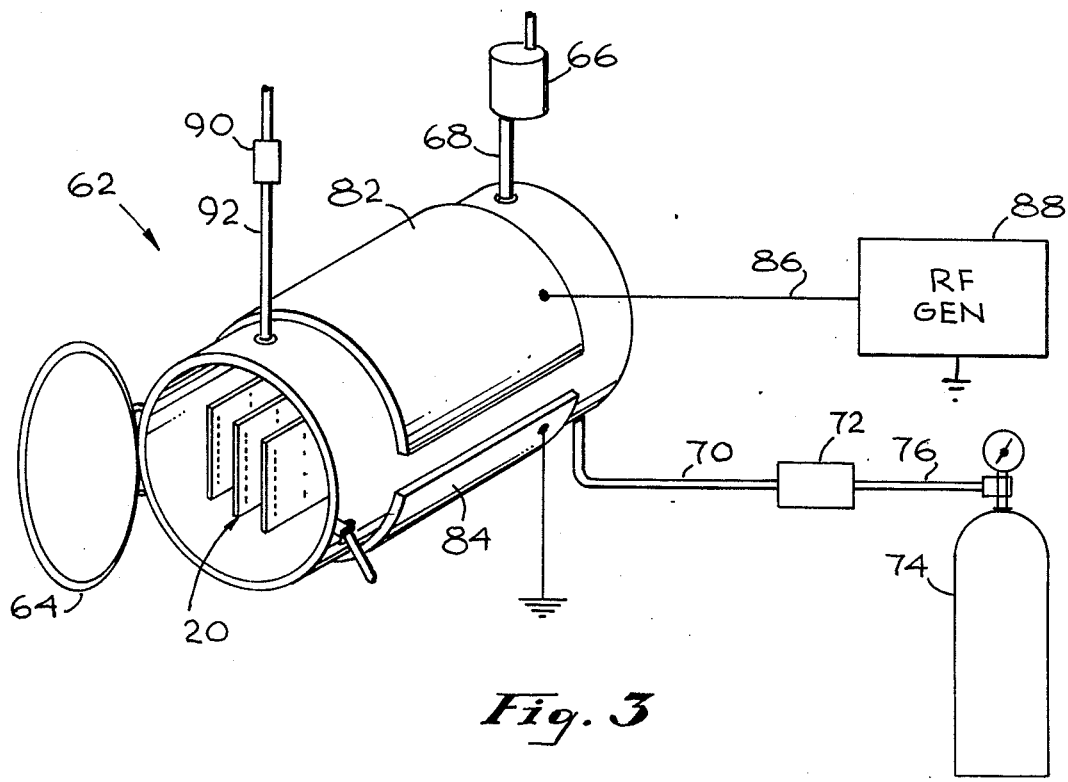
Fig. 3

METHOD FOR CONDITIONING DRILLED HOLES IN MULTILAYER WIRING BOARDS

BACKGROUND OF THE INVENTION

1. Field of the Invention.

The present invention relates to the field of gas plasma treating the plastic materials and, more particularly, to gas plasma etching of drilled, multilayer printed wiring boards prior to metal plating of conductive layer interconnections.

2. Description of the Prior Art.

Multilayered printed circuit or wiring boards, whether rigid or flexible, are typically constructed having a number of layers of copper conductor patterns separated by layers of insulating plastic. Between the plastic and copper layers, an organic adhesive layer, e.g. epoxy, phenolic butyral, acrylic etc., is used to form an adhesive bond. When fabrication of the boards is complete, numbers of small holes or apertures are drilled through the boards in particular locations at which two or more copper layers are to be interconnected. A metallic conductor, for example copper, is then plated into the apertures to make electrical contact between exposed edge portions of the copper conductive layers to thereby interconnect such layers.

During the drilling operation, however, the drill frequently smears a thin layer or coating of plastic and/or adhesive around the inside of the apertures. These smeared layers, which may cover all or most of the otherwise exposed edges of the copper layers, tend to insulate such edges and, if not completely removed prior to the interconnect metal plating, prevent good electrical contact from being made with the copper layers. Hence, good electrical interconnecting between the copper layers is prevented. In addition, small fragments of plastic, torn from the circuit board during the drilling operation, may project into the apertures and cause similar effects.

Complete removal of these smeared, insulating layers and torn plastic fragments is thus essential prior to plating of the interconnecting metal. Heretofore, such smeared layers and particle removal has been accomplished by chemically etching the drilled multilayered boards with strong liquid chemicals, for example, concentrated sulphuric acid, strong chromic acid and/or strong alkaline solutions, which dissolve the smeared material (as well as small amounts of the non-metallic laminations wherever exposed). Such wet etching procedure has been required to be comparatively lengthy and complex to assure complete removal from the apertures of the smeared material and particles, and to assure removal of all traces of the etching chemicals used in order to prevent subsequent damage to the boards and electronic components mounted thereto. A typical pre-etching, etching and cleaning or neutralizing process thus comprises as many as 10 to 30 separate steps, for example, including various water rinses, chromate neutralizing and other rinsing steps, including an acid dip, and is accordingly very timeconsuming and expensive. Also wet chemical etching still often results in poor metal plating adhesion and thus high board rejection rates. In addition, certain materials, such as Dupont's Pyralux, used in the construction of flexible printed circuit boards are not compatible with the commonly used wet chemical etchants. Obviously, there is much need for improved, less complicated and less time-consuming processes for removing the smeared layers from drilled apertures in printed circuit boards and the like.

Within the past few years, many wet chemical etching processes have been replaced to advantage by dry gas plasma etching processes. Some of the gas molecules in the plasma are ionized; many others are ruptured to create a large number of free radicals that is, molecular fragments containing unpaired electrons which are not involved in chemical bonding. This presence of ions and particularly the free radicals makes the plasma extremely reactive (thus effective as an etchant). The plasma state is, by its nature, so unstable that energy must be continuously supplied to maintain it. Typical applications of such plasma etching include surface etching of comparatively stable plastics, such as Teflon, having surfaces which will not otherwise accept paints, dyes, inks, adhesives etc. Previously such surface treatment was by chemical etching or mechanical abrasion.

The most useful plasmas for such etching operations have been found to be low temperature, low pressure plasmas--plasmas having temperatures typically in a range from about 50°–200° or 250° C. and pressure in the range of from about 0.1–200 torr, and in which usually fewer than about 1% of the gas particles may be ionized. Such may contain more than 90% free radicals. Because such plasmas neither require nor generate excessive heat during operation, they can safely be used to treat materials, such as plastics, without adversely affecting their structural properties. The equipment employed for generating and using low temperature, low pressure plasmas is relatively simple and avoids major problems associated with the wet chemical etching processes; since the plasma reaction products are gaseous in form, substantially no solid residues are left upon completion of the plasma etching process. Typically the gases used in such plasma etching processes are oxygen ($O_2$) or a mixture of oxygen and carbon tetrafluoride ($CF_4$), the carbon tetrafluoride serving as a source of atomic fluorine, a powerful oxidizing agent.

Some use has accordingly been made of plasma etching techniques in the electronics industry. For example, the Jacob U.S. Pat. No. 3,806,365 discloses use of a plasma of oxygen and organohalides to remove photoresist and its associated inorganic contaminants from surfaces of semiconductor materials. LaCombe U.S. Pat. Nos. 3,816,196 and 3,816,198 disclose use of an oxygen plasma to etch patterns onto plastic films through a photoresist mask, for microcircuit fabrication. The Irving U.S. Pat. No. 3,615,956 discloses the use of an oxygen and carbon tetrafluoride plasma to polish and clean silicon wafers, to etch break lines in the wafers and to locate pin holes in insulating oxide films on the wafer surfaces. An article by Bersin entitled "The Fourth State", P. 60, Industrial Research, April 1975 generally described the properties and uses of plasma in the treating of surfaces.

However, insofar as is known, no disclosure has heretofore been made of utilizing a gas plasma for treating multilayer printed wiring or circuit boards (of either the rigid or flexible type) to remove smeared layers and torn plastic fragments in drilled holes or to etch-back the non-metallic layers prior to metal plating of conductive layer interconnects.

SUMMARY OF THE INVENTION

A method for conditioning drilled holes in multilayer printed circuit boards, prior to metal plating of conductive layer interconnects, includes placing drilled, printed circuit boards into a plasma reactor chamber; evacuating the chamber to a first predetermined pressure; injecting into the chamber a gas, selected from the group consisting of oxygen and a mixture of oxygen and carbon tetrafluoride, at a suitable rate so that the partial pressure of the second gas is at a second predetermined pressure; activating a radio frequency generator to create a plasma in the chamber; maintaining the plasma in the chamber for a predetermined time interval; deactivating the radio frequency generator and admitting air into the reactor chamber; and opening the chamber and removing the printed circuit boards therefrom. The method may also include the steps of baking the drilled, printed circuit boards at a temperature of about 49°–71° C. for approximately ½ to 1 hour before placing the boards in the chamber, and of purging the gases from the chamber after air is admitted thereinto and before removing the printed circuit boards therefrom. The method may also include the step of maintaining the reactor chamber at a temperature in the range of about 50°–200° C. while the radio frequency generator is activated to maintain the gas plasma.

More specifically, the first predetermined pressure is in the range of about 0.1–200 torr. Preferably, the first predetermined pressure is approximately 0.2 torr and the second predetermined pressure is about 0.4 torr when the oxidizing gas is oxygen alone, and is approximately 0.6 torr when a mixture of oxygen and carbon tetrafluoride is used; in the latter case the partial pressure of oxygen is approximately 0.2 torr and the partial pressure of carbon tetrafluoride is approximately 0.2 torr.

By means of the described plasma etching method, thin layers of plastic and adhesive materials smeared around the inner periphery of holes drilled in the printed circuit boards by the drilling operation, as well as torn fragments of circuit board plastic projecting into such apertures are quickly, easily and inexpensively removed without the use of wet chemical reagents which are dangerous to use and which require substantial cleaning and neutralizing operations to remove all residual traces of the chemicals after the etching operation. In addition, the plasma etching operation undercuts or etches back non-metallic portions of the multilayer printed circuit board adjacent to the copper layers in the region of the drilled holes, thereby providing an increased exposed surface area of the copper layers to which the metal interconnect layer is subsequently plated and thus improving mechanical adhesion of the interconnecting metal.

BRIEF DESCRIPTION OF THE DRAWING

A better understanding of the present invention may be had from a consideration of the following detailed description, taken in conjunction with the accompanying drawing, in which:

FIG. 1 is a magnified vertical sectional view of a multilayer flexible printed circuit board in the region of an aperture drilled therethrough, showing a smeared plastic and/or adhesive layer in the aperture and a layer of metal interconnecting plating applied thereto;

FIG. 2 is a magnified vertical sectional view of the flexible printed circuit board of FIG. 1 in the region of the aperture, showing the effects of gas plasma etching and showing a metallized portion of the printed circuit board; and FIG. 3 is a schematic drawing of one type of apparatus used in the gas plasma etching process.

DESCRIPTION OF THE PREFERRED EMBODIMENT

A typical multilayer flexible printed circuit or wiring board 20 is illustrated in FIG. 1 which shows, in cross section, the board in the vicinity of a hole drilled therethrough. According to one method of construction, for example, the board 20 comprises an upper copper conductor layer 22, an epoxy layer 24, a plastic layer 26, for example of Kapton, a next epoxy layer 28 and then a copper layer 30. Formed, in order, below this copper layer 30 are a phenolic butyral layer 32, an epoxy primer layer 34, a Kapton layer 36, an epoxy primer layer 38, a layer of phenolic butyral 40, a copper layer 42, an epoxy layer 44, a Kapton layer 46, and an epoxy layer 48. Finally a copper layer 50 is formed at the bottom of the board 20.

Normally, and by way of brief background, when a hole or aperture 52 is drilled through the board 20, a thin irregular layer 54 of plastic, e.g. epoxy and/or phenolic butyral adhesive bonding the laminates together, may be smeared by the drill along and around the periphery of the aperture. Additionally, small fragments of plastic (not shown) may be torn from the circuit board 20 during the drilling operation and lodge in the apertures. It is to be understood that hereinafter when reference is made to the layer 54 these small torn fragments of plastic, which produce the same effect, are included. If, then, a metallization layer 60 is plated down through the apertures 52 to interconnect the copper layers, the layer 54, which is formed of insulating materials, may prevent adequate electrical contact between the metallization layer and otherwise exposed edges of the copper layers, and defective interconnection will result.

Not only may defective electrical interconnecting be a consequence, but the normal mechanical adhesion strength of the metallization layer 60, in the region of the layer 54, is substantially degraded and portions of the metallization may easily be pulled or torn from the aperture 52. Heretofore, as previously mentioned, the layer 54 (of both rigid and flexible circuit boards) has been removed prior to interconnect plating by a complicated procedure employing strong wet chemical reagents.

It has been determined, however, that the layers 54 may be quickly, easily, safely and inexpensively removed from multilayer circuit board apertures, such as the aperture 52a of FIG. 2, by a gas plasma etching process (more particularly described below) which avoids use of the previously used dangerous and highly corrosive liquid chemical etchants. In addition, as illustrated in FIG. 2, the plasma etching process effectively undercuts or etches back non-metallic layers of the board 20a adjacent to exposed edges of the conductive copper layers 22, 30, 42 and 50, so that a subsequently applied layer 60a of metal plating surrounds projecting edge portions of the copper layers, thereby providing increased adhesion area and thus increased mechanical bonding strength.

In general, the plasma etching process includes placing drilled, printed circuit boards, such as the circuit board 20, into a plasma reactor chamber 62, as illustrated in FIG. 3. The chamber door 64 is then closed and pressure within the chamber is reduced to the approximate range of from 0.1–200 torr by a vacuum pump 66 connected to the chamber 62 by a vacuum line 68. A heater, not shown, may or may not be included to maintain the temperature of the chamber 62 at a pre-selected temperature, preferably within the range of about 50°–200° C. during the plasma etching process.

After pressure in the chamber 62 has been reduced to the predetermined level, a gas capable of forming an oxidizing plasma, such as oxygen, or a mixture of gases capable of forming an oxidizing plasma, such as oxygen and carbon tetrafluoride, is introduced into the reactor chamber 62 through a line 70, by a control valve 72 which is connected to a gas bottle (or bottles) 74 by a gas line 76. The mixture of oxygen and carbon tetrafluoride has been determined to be particularly effective in the plasma etching process because the carbon tetrafluoride serves as a source of atomic fluorine, a very powerful oxidizing agent, which quickly reacts with the organic matter of the layer 54 and also quickly etches back portions of the boards adjacent to the copper layers (FIG. 2).

More particularly, the plasma reactor 62 is preferably evacuated to a pressure of about 0.2 torr and the gases which will be activated to form the etching plasma are introduced into the reactor in suitable quantities so that the partial pressure of the oxygen—if oxygen along is used--is about 0.2 torr, and, when a mixture of oxygen and carbon tetrafluoride is used, the partial pressure of oxygen is about 0.2 torr and the partial pressure of carbon tetrafluoride is about 0.2 torr; the total pressure in the reactor being about 0.6 torr.

With one particular type of plasma generating system, two mutually spaced electrodes--an upper electrode 82 and a lower electrode 84—are positioned around the outer surface of the chamber 62. The lower electrode 84 is grounded and the upper electrode 82 is connected, by a conductor 86, to a conventional radio frequency (RF) generator 88. After the oxygen (or mixture of oxygen and carbon tetrafluoride) has been introduced into the chamber 62, the RF generator 88 is activated to thereby create a gas plasma in the chamber according to well-known principles. The generator power required depends principally upon the volume of the reactor chamber 62 and the total surface area of the circuit boards introduced into the chamber.

The plasma is sustained by maintaining activation of the generator 88 for an etching time in the range of about 0.1–20 minutes, the optimum time depending upon the temperature maintained in the chamber and the partial pressure of the gases used, as well as the configuration of the chamber, the arrangement of the circuit boards 20 within the chamber, and the degree of etching desired. The optimum etching time is easily determined by treating a sample board for increasingly shorter lengths of time. In general, assuming a mixture of oxygen and carbon tetrafluoride, at the abovementioned partial pressures, a time of several minutes such as 7 to 10, for example, is usually required to provide complete layer 54 removal from several large circuit boards and to cause sufficient etch-back to provide improved adhering of the copper interconnecting layer 60a (FIG. 2).

At the end of the pre-selected ething time, the RF generator 88 is shut off and a valve 90, connected to the chamber 62 by an air line 92, is opened to allow atmospheric air into the chamber 62 and thereby equalize the reactor pressure to atmospheric pressure. Gases are then purged from the reactor 62 by purge lines (not shown), the door 64 is opened and the boards 20 are removed from the chamber. The boards 20 are then ready for plating of the interconnecting layer 60a, for example, by a conventional electroless plating process which may then be followed by electro-plating.

It has been found that the plasma etching process, abovedescribed, can benefit by baking the circuit boards 20 in an oven at about 49°–71° C. for ½ to 1 hour after the apertures 52 have been drilled and just before starting the above described plasma etching process. This is to avoid possible delamination of the circuit boards by moisture trapped in the laminate.

By the method described, the smear layers 54 are efficiently and effectively removed without the use of corrosive and dangerous wet chemicals. The gas plasma etching process is equally applicable to materials, such as DuPont's Pyralux and Rexham's Monotherm, used for construction of flexible printed circuit boards as it is for materials used for constructing rigid printed circuit boards, epoxy-fiberglass, for example. No complicated post-etching rinsing or chemical neutralizing is required, since the materials comprising the layers 54 and the etched-back board portions are converted to a gas or vapor which is effectively purged from the reactor without leaving any residue on the boards. In addition, the etching-back accomplished by the plasma etching process greatly enhances adhesion of the subsequently applied interconnect metallization to the exposed edges of the plastic, or non-conductive, layers of the boards.

Although there has been described above a specific method for conditioning drilled holes in multilayered printed circuit boards in accordance with the invention for the purpose of illustrating the manner in which the invention can be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. A method for conditioning drilled holes in multilayer printed wiring boards prior to metal plating of conductive layer interconnects, which comprises the steps of:
   a. baking the printed wiring boards at a temperature of about 49°–71° C. for a pre-selected length of time;
   b. installing the printed wiring boards into a plasma reactor chamber;
   c. evacuating the plasma reactor chamber to a first pre-selected pressure;
   d. injecting into the reactor chamber a gas capable of forming an oxidizing plasma selected from the group consisting of oxygen and a mixture of oxygen and carbon tetrafluoride so that the partial pressure of the gas is at a second pre-selected pressure;
   e. activating the radio frequency generator connected to the reactor chamber to create a gas plasma in the chamber;

f. maintaining the generator in an activated condition to maintain the plasma in the chamber for a pre-selected length of time;

g. deactivating the radio frequency generator and admitting air into the reactor chamber to equalize the internal pressure with that of the atmosphere;

h. purging the gases from the reactor chamber after air is admitted thereinto; and i. opening the reactor chamber and removing the printed wiring boards therefrom.

2. The method according to claim 1, wherein the baking step comprises baking the boards for approximately ½ to 1 hour.

3. The method according to claim 1, wherein the pre-selected length of time that the radio frequency generator is activated is in the range of 0.1–20 minutes.

4. The method according to claim 1, including the step of maintaining the reactor chamber at a temperature in the range of about 50°–200° C. while the radio frequency generator is activated.

5. The method according to claim 1, wherein said first pre-selected pressure is in the range of about 0.1–200 torr.

6. The method according to claim 5, wherein the injecting step includes injecting oxygen to develop a partial pressure of oxygen of 0.2 torr.

7. The method according to claim 5, wherein the injecting step includes injecting a mixture of oxygen and carbon tetrafluoride to develop a partial pressure of 0.2 torr for each gas in said mixture.

8. The method as claimed in claim 1 wherein said first pre-selected pressure is approximately 0.2 torr and the second pre-selected pressure is approximately 0.2 torr, the oxidizing gas being oxygen, for a total pressure of approximately 0.4 torr.

9. The method as claimed in claim 1 wherein said first pre-selected pressure is approximately 0.2 torr and the second pre-selected pressure is about 0.4 torr, the oxidizing gas being a mixture of oxygen and carbon tetrafluoride, for a total pressure of 0.6 torr.

10. The method as claimed in claim 9 wherein the partial pressure of the oxygen is approximately 0.2 torr and the partial pressure of the carbon tetrafluoride is also approximately 0.2 torr.

* * * * *